United States Patent
Jeong et al.

(10) Patent No.: US 8,623,729 B2
(45) Date of Patent: Jan. 7, 2014

(54) METHODS OF FABRICATING SEMICONDUCTOR DEVICES WITH SILICON-GERMANIUM CHANNELS INCLUDING HYDROGEN

(75) Inventors: Yongkuk Jeong, Suwon-si (KR); Hyun-Kwan Yu, Suwon-si (KR); Kieun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/422,627

(22) Filed: Mar. 16, 2012

(65) Prior Publication Data

US 2012/0238066 A1    Sep. 20, 2012

(30) Foreign Application Priority Data

Mar. 18, 2011 (KR) .................. 10-2011-0024428

(51) Int. Cl.
*H01L 21/335* (2006.01)
(52) U.S. Cl.
USPC ........................................... 438/285; 257/351
(58) Field of Classification Search
USPC ................ 438/285, 197, 142, 151, 585, 49
See application file for complete search history.

(56) References Cited

U.S. PATENT DOCUMENTS

| | | | |
|---|---|---|---|
| 7,078,282 B2 | 7/2006 | Chau et al. | |
| 7,348,231 B2 | 3/2008 | Kwon et al. | |
| 2005/0145894 A1 | 7/2005 | Chau et al. | |
| 2006/0148153 A1 | 7/2006 | Kwon et al. | |
| 2006/0237804 A1 | 10/2006 | Chau et al. | |
| 2010/0078687 A1 | 4/2010 | Zhang et al. | |
| 2011/0169095 A1* | 7/2011 | Chen et al. | 257/369 |
| 2011/0207273 A1* | 8/2011 | Jeong | 438/231 |

FOREIGN PATENT DOCUMENTS

| | | |
|---|---|---|
| KR | 10-0702006 B1 | 3/2007 |
| KR | 10-0856436 B1 | 8/2008 |

\* cited by examiner

*Primary Examiner* — Zandra Smith
*Assistant Examiner* — Damian A Hillman
(74) *Attorney, Agent, or Firm* — Myers Bigel Sibley & Sajovec, P.A.

(57) ABSTRACT

A semiconductor device is fabricated by providing a substrate including a silicon channel layer and a silicon-germanium channel layer, forming gate structures disposed on the silicon channel layer and on the silicon-germanium channel layer, forming a first protection layer to cover the resultant structure including the gate structures, and injecting hydrogen and/or its isotopes into the silicon-germanium channel layer. The silicon and silicon-germanium channel layers may be oriented along a <100> direction. Related devices are also described.

16 Claims, 13 Drawing Sheets

METHODS OF FABRICATING SEMICONDUCTOR DEVICES WITH SILICON-GERMANIUM CHANNELS INCLUDING HYDROGEN

CROSS-REFERENCE TO RELATED APPLICATION

This U.S. non-provisional patent application claims priority under 35 U.S.C. §119 to Korean Patent Application No. 10-2011-0024428, filed on Mar. 18, 2011, in the Korean Intellectual Property Office, the entire contents of which are hereby incorporated by reference.

BACKGROUND

Various embodiments described herein relate generally to semiconductor devices and methods of fabricating the same. More particularly, various embodiments described herein relate to semiconductor devices that can provide improved p-type metal-oxide-semiconductor (PMOS) performance, and methods of fabricating the same.

With increasing demand for high speed semiconductor devices, a metal-oxide-semiconductor field effect transistor (MOSFET) including a high-k gate insulating layer and a metal gate electrode has been extensively studied. Recently, a way of changing a crystal structure of a channel region of MOSFET has been proposed, using tensile and/or compressive stress layers, so as to improve an electric characteristic of MOSFET. However, there have been some technical difficulties in enhancing the electric characteristics for both types of MOSFET (i.e., n- and p-type MOSFETs).

SUMMARY

Various embodiments described herein can provide semiconductor devices with improved PMOS performance.

Various other embodiments described herein can provide methods of fabricating semiconductor devices with improved PMOS performance.

According to various embodiments described herein, a method of fabricating a semiconductor device may include providing a substrate including a silicon channel layer and a silicon-germanium channel layer, forming gate structures disposed on the silicon channel layer and the silicon-germanium channel layer, respectively, forming a first protection layer on the substrate, including on the gate structures, and injecting hydrogen and/or an isotope thereof into the silicon-germanium channel layer.

In some embodiments, the first protection layer may comprise a tensile material.

In some embodiments, the injecting of hydrogen and/or an isotope thereof may be followed by the forming of the first protection layer. In other embodiments, the injecting of hydrogen and/or an isotope thereof may follow the forming of the first protection layer.

In yet other embodiments, the injecting of hydrogen and/or an isotope thereof may be performed by a chemical vapor deposition in which a process gas includes the hydrogen and/or the isotope thereof.

In even other embodiments, the injecting of hydrogen and/or an isotope thereof may include forming a second protection layer on the gate structures, wherein the first and second protection layers comprise tensile materials. For instance, the first and second protection layers may comprise silicon nitride, and the second protection layer may have a greater process-induced charging property than the first protection layer.

In still further embodiments, before forming the first protection layer, the methods may further include forming gate spacers on sidewalls of the gate structures to spatially separate the first protection layer from the sidewalls of the gate structures.

In yet further embodiments, the forming of the gate structures may include forming a metal oxide layer on the substrate, forming a metal layer on the metal oxide layer, and patterning the metal layer to form a metal gate electrode crossing over the silicon channel layer or the silicon-germanium channel layer.

According to various other embodiments described herein, a semiconductor device may include an n-type MOS (NMOS) transistor including a channel layer and a gate structure on the channel layer and a PMOS transistor including a channel layer and a gate structure on the channel layer. The channel layers of the NMOS and PMOS transistors may have channel directions of <100>. The channel layer of the NMOS transistor may comprise silicon, and the channel layer of the PMOS transistor may comprise silicon-germanium that includes therein hydrogen and/or an isotope thereof.

In some embodiments, the device may further include a first protection layer on the NMOS and PMOS transistors including the gate structures, and the first protection layer comprises a tensile material.

In other embodiments, the device may further include a second protection layer on the first protection layer. Here, the second protection layer may comprise a material having a higher content of hydrogen and/or an isotope thereof than the first protection layer. In other embodiments, the second protection layer may comprise a material having a greater process-induced charging property than the first protection layer.

In still other embodiments, the first and second protection layers may comprise tensile materials.

In yet other embodiments, the device may further include gate spacers disposed on sidewalls of the gate structures of the NMOS and PMOS transistors, respectively, to spatially separate the first protection layer from the sidewalls of the gate structures. The gate spacer may comprise silicon oxide, silicon nitride and/or silicon oxynitride.

In even other embodiments, the gate structure may include a metal gate electrode including a metallic material and a metal oxide layer interposed between the metal gate electrode and the channel region.

According to various other embodiments described herein, a semiconductor device comprises a PMOS transistor including a channel layer and a gate structure on the channel layer. The channel layer of the PMOS transistor comprises silicon-germanium, and includes therein hydrogen and/or an isotope thereof. Thus, various embodiments described herein may apply to PMOS transistors independent of their combination with NMOS transistors. These embodiments may also include a first protection layer, a second protection layer and/or gate spacers, as described above.

BRIEF DESCRIPTION OF THE DRAWINGS

Various embodiments will be more clearly understood from the following brief description taken in conjunction with the accompanying drawings.

FIGS. 1 through 5 are sectional views illustrating methods of fabricating a semiconductor device according to various embodiments described herein;

FIG. 6 is a sectional view illustrating methods of fabricating a semiconductor device according to various modified embodiments described herein;

FIGS. 7 and 8 are diagrams schematically illustrating some aspects of a semiconductor device according to embodiments described herein;

FIG. 9 is a sectional view illustrating methods of fabricating a semiconductor device according to various other embodiments described herein;

FIG. 10 is a sectional view illustrating methods of fabricating a semiconductor device according to various other modified embodiments described herein;

FIGS. 11 and 12 are graphs showing experimental results related to first and second protection layers of a semiconductor device according to various embodiments described herein;

FIGS. 13 and 14 are graphs showing electric characteristics of a semiconductor device according to some embodiments described herein;

FIGS. 15-19 are sectional views illustrating methods of fabricating PMOS transistors according to various embodiments described herein;

FIG. 20 is a sectional view illustrating methods of fabricating a PMOS transistor according to various modified embodiments described herein;

FIG. 21 is a sectional view illustrating methods of fabricating PMOS transistor according to various other embodiments described herein;

FIG. 22, is a sectional view illustrating methods of fabricating a PMOS transistor according to various other modified embodiments described herein; and FIGS. 23 and 24 are block diagrams schematically illustrating electronic devices including a semiconductor device according to various embodiments described herein.

Figure 1:
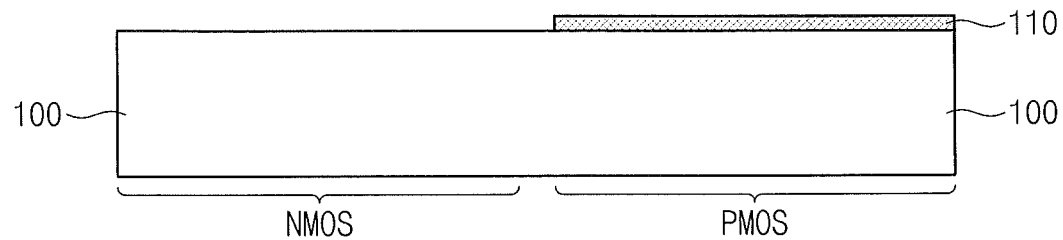
FIGS. 1-24 represent non-limiting, example embodiments as described herein.

It should be noted that these figures are intended to illustrate the general characteristics of methods, structures and/or materials utilized in various embodiments described herein and to supplement the written description provided below. These drawings are not, however, to scale and may not precisely reflect the precise structural or performance characteristics of any given embodiment, and should not be interpreted as defining or limiting the range of values or properties encompassed by various embodiments described herein. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various embodiments described herein will now be described more fully with reference to the accompanying drawings, in which example embodiments are shown. Various embodiments described herein may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Various embodiments described herein are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of various embodiments described herein.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1 through 5 are sectional views illustrating methods of fabricating a semiconductor device according to various embodiments described herein.

Referring to FIG. 1, a PMOS channel layer 110 may be formed on a PMOS region of a substrate 100 that is divided into NMOS and PMOS regions. The semiconductor substrate 100 may include a single element and/or compound semiconductor material in bulk wafer and/or epitaxial layer form. The substrate 100 may be formed of a single-crystalline silicon layer. For instance, the substrate 100 may be provided as a silicon wafer or a silicon-on-insulator (SOI) wafer. In some embodiments, the PMOS channel layer 110 may be an epitaxial layer grown on the substrate 100.

Figure 7:
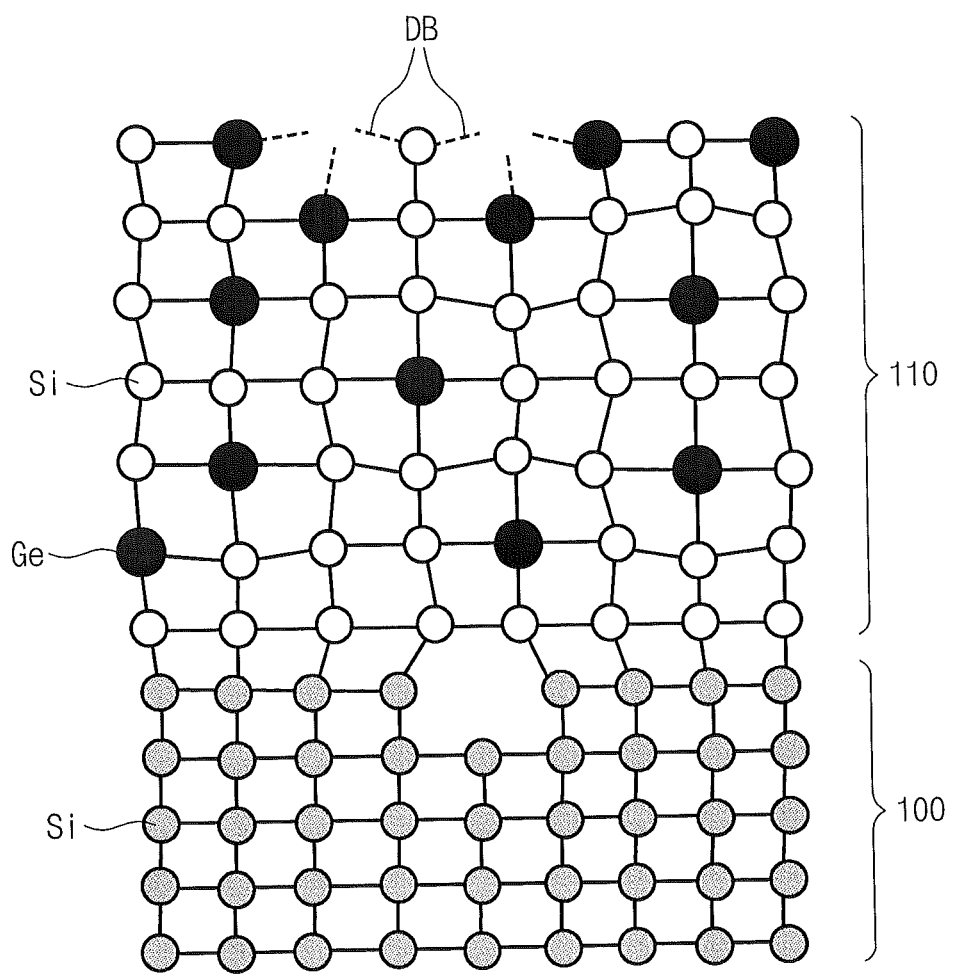

The PMOS channel layer 110 may be a silicon germanium layer, which is grown from silicon atoms of the substrate 100 using an epitaxial technique, as shown in FIG. 7. As a result, a lattice structure of the PMOS channel layer 110 may be determined by a lattice structure of the substrate 100. In some embodiments, the PMOS channel layer 110 may include about 30 atomic percent germanium. Meanwhile, the PMOS channel layer 110 may include dangling bonds that can deteriorate electrical properties of a channel region, as shown in FIG. 7. According to various embodiments described herein, the number of the dangling bonds can be effectively reduced by a hydrogen injection process, which will be described, for example, with reference to FIG. 5.

The substrate 100 may further include a NMOS region, in which NMOS field effect transistors (FETs) are disposed. As noted above, the PMOS channel layer 110 may comprise a silicon germanium layer. Furthermore, the PMOS channel layer 110 may be locally formed on the PMOS region to expose the NMOS region of the substrate 100. In some embodiments, the PMOS channel layer 110 may be formed using a selective epitaxial technique such that it can be prevented from being formed on the NMOS region. In other embodiments, the PMOS channel layer 110 may be entirely formed on the substrate 100 using an epitaxial or deposition technique and partially removed from the NMOS region to expose a top surface of the substrate 100 thereunder.

Figure 2:
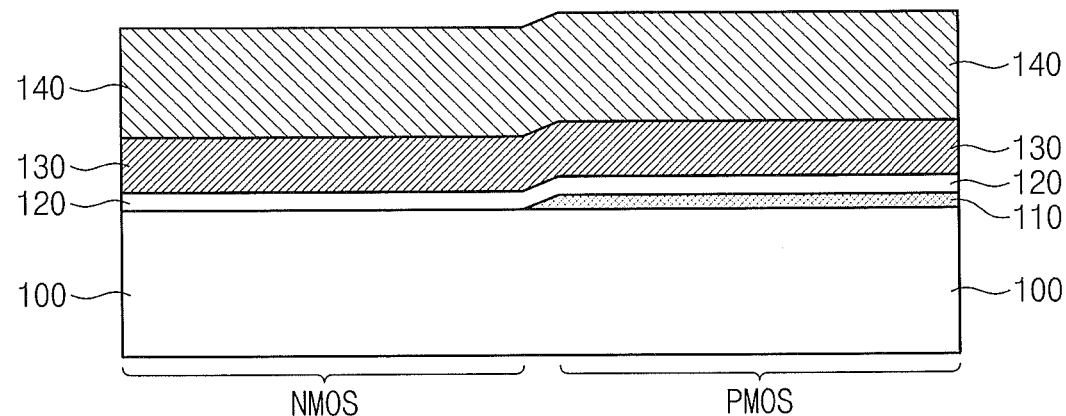

Referring to FIG. 2, a gate insulating layer 120, a lower gate layer 130 and an upper gate layer 140 may be sequentially formed on the resultant structure including the PMOS channel layer 110.

The gate insulating layer 120 may be in direct contact with a top surface of the substrate 100 in the NMOS region and with a top surface of the PMOS channel layer 110 in the PMOS region.

The gate insulating layer 120 may comprise at least one oxide. The gate insulating layer 120 may comprise an insulating material having a higher dielectric constant than silicon oxide, commonly referred to as a "high-k" material. In some embodiments, the gate insulating layer 120 may include a metal oxide (for instance, hafnium oxide).

The lower gate layer 130 may include metallic materials. For instance, the lower gate layer 130 may include tantalum nitride (TaN), titanium nitride (TiN), tungsten (W), tungsten nitride (WN), molybdenum nitride (MoN), molybdenum aluminum nitride (MoAlN), platinum (Pt), nickel (Ni), ruthenium (Ru), titanium aluminum nitride (TiAlN), tantalum carbide (TaC), tantalum silicon nitride (TaSiN), and/or titanium aluminide (TiAl).

In some embodiments, the lower gate layer 130 on the NMOS region may comprise a different material from that of the PMOS region. In other embodiments, the lower gate layer 130 on the NMOS region may comprise the same material as that of the PMOS region.

The upper gate layer 140 may include at least one conductive material. For example, the upper gate layer 140 may comprise a doped or un-doped silicon layer.

Figure 3:
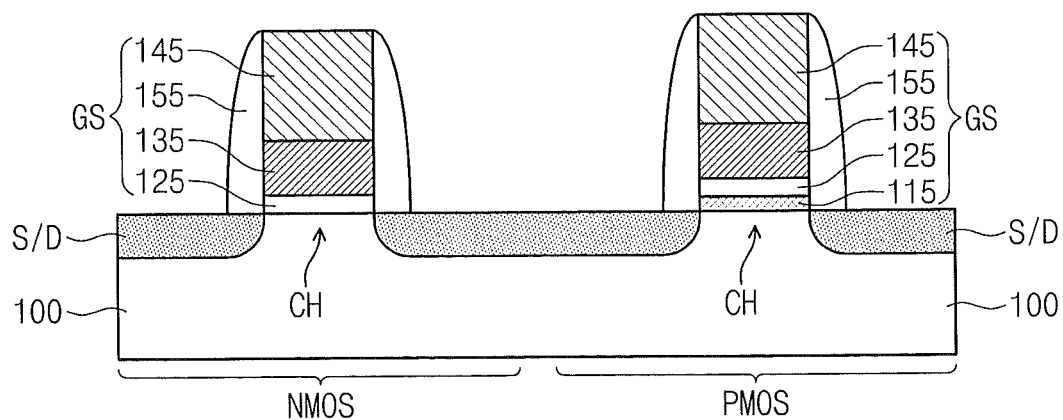

Referring to FIG. 3, gate structures GS may be formed on the substrate 100 and source and drain regions S/D may be formed in the substrate 100. The gate structure GS may include an upper gate electrode 145 and a lower gate electrode 135, which may be formed by patterning the upper gate layer 140 and the lower gate layer 130. The source and drain regions S/D may be formed by an ion implantation process using the gate structure GS as an ion implantation mask. In other words, the source and drain regions S/D may be formed in the substrate 100 at both sides of the gate structure GS, respectively, and a channel region CH may be defined in a portion, below the gate structure GS, of the substrate 100 (i.e., between the source and drain regions S/D).

In some embodiments, the gate structure GS may further include a gate insulating layer pattern 125, which may be formed by patterning the gate insulating layer 120. For example, the formation of the gate structure GS may include etching the upper gate layer 140, the lower gate layer 130, and the gate insulating layer 120, sequentially and anisotropically, using the same etch mask. In this case, as shown in FIG. 3, the upper gate electrode 145, the lower gate electrode 135, and the gate insulating layer pattern 125 may be formed to have sidewalls aligned with each other. In other words, the sidewalls thereof may be substantially coplanar with each other.

In some embodiments, the PMOS channel layer 110 may be etched during the formation of the gate structure GS. In this case, a localized PMOS channel pattern 115 may be formed below the gate structure GS. In other embodiments, the PMOS channel pattern 115 may remain on the source and drain regions S/D.

In some modified embodiments, after the formation of the gate structure GS, gate spacers 155 may be formed on sidewalls of the gate structure GS. The PMOS channel pattern 115 may be localized during the formation of the gate spacers 155. For instance, the PMOS channel pattern 115 may include an extended portion (not shown) interposed between the gate spacer 155 and the substrate 100. The gate spacers 155 may comprise silicon oxide, silicon nitride and/or silicon oxynitride.

The source and drain regions S/D may be formed by an ion implantation process using the gate spacer 155 as an ion implantation mask. For instance, the formation of the source and drain regions S/D may include first and second ion implantation processes performed before and after the formation of the gate spacer 155, respectively.

The source and drain regions S/D in the NMOS region may have a different conductivity type from the source and drain regions S/D in the PMOS region. For instance, the source and drain regions S/D may be p-type in the PMOS region and n-type in the NMOS region. The PMOS channel pattern 115 may have the same conductivity type as a portion of the substrate 100 disposed thereunder but may have a different conductivity type from the source and drain region S/D disposed adjacent thereto.

Meanwhile, the gate structure GS may be patterned in such a way that the channel region CH defined by the gate structure GS can be oriented along a <100> direction. For example, the gate structure GS or the channel region CH may be formed on a 45 degree rotated wafer or substrate. In other words, the PMOS and NMOS transistors may be formed with a <100> crystal channel orientation.

Figure 4:
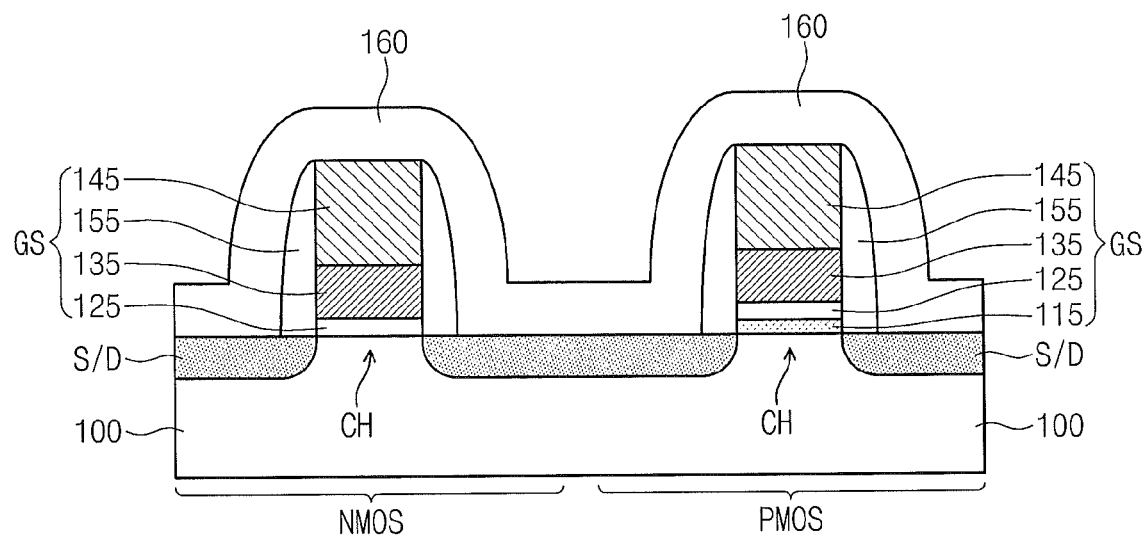

Referring to FIG. 4, a first protection layer 160 may be formed on the resultant structure provided with the source and drain regions S/D. The first protection layer 160 may comprise a tensile material. For instance, the first protection layer 160 may include a material with a tensile stress of about 0.5 GPa to about 3 GPa. In some embodiments, the first protection layer 160 may be a single layer structure, not a multilayer structure. For instance, the first protection layer 160 may be a single layer of silicon nitride.

In the case that the first protection layer 160 comprises a tensile material, a tensile stress may be applied to the channel regions CH of the NMOS and PMOS regions. A carrier mobility in the channel region CH of the NMOS region can be improved by the tensile stress, while the PMOS region may be insensitive to the tensile stress.

The first protection layer 160 may reduce or prevent elements or layers located therebelow from being damaged during a subsequent process of forming a contact hole. For instance, in the case that the first protection layer 160 comprises silicon nitride, it may have an etch selectivity with respect to silicon oxide, which may be conventionally used as an interlayer dielectric. Thus, the contact hole penetrating the interlayer dielectric can be formed to expose the source and drain regions S/D or the gate structures GS, which are disposed below the first protection layer 160, without an excessive etch damage.

Figure 5:
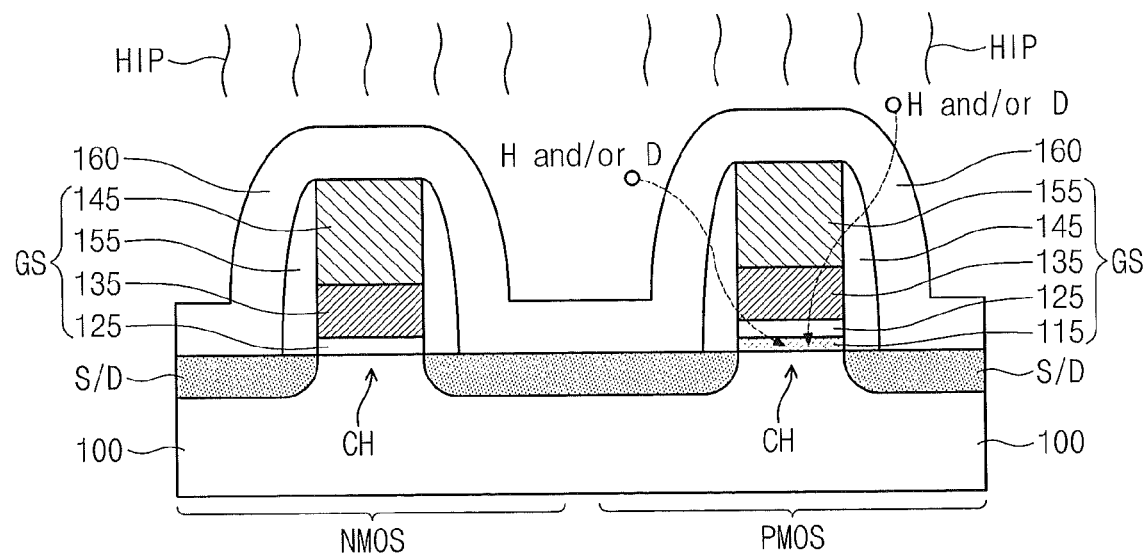

Referring to FIG. 5, after the formation of the first protection layer 160, a hydrogen injection process HIP may be performed to inject hydrogen (H) and/or an isotope thereof, such as deuterium (D) into the PMOS channel pattern 115. For instance, a process gas containing hydrogen or deuterium may be used for the hydrogen injection process HIP.

Figure 8:
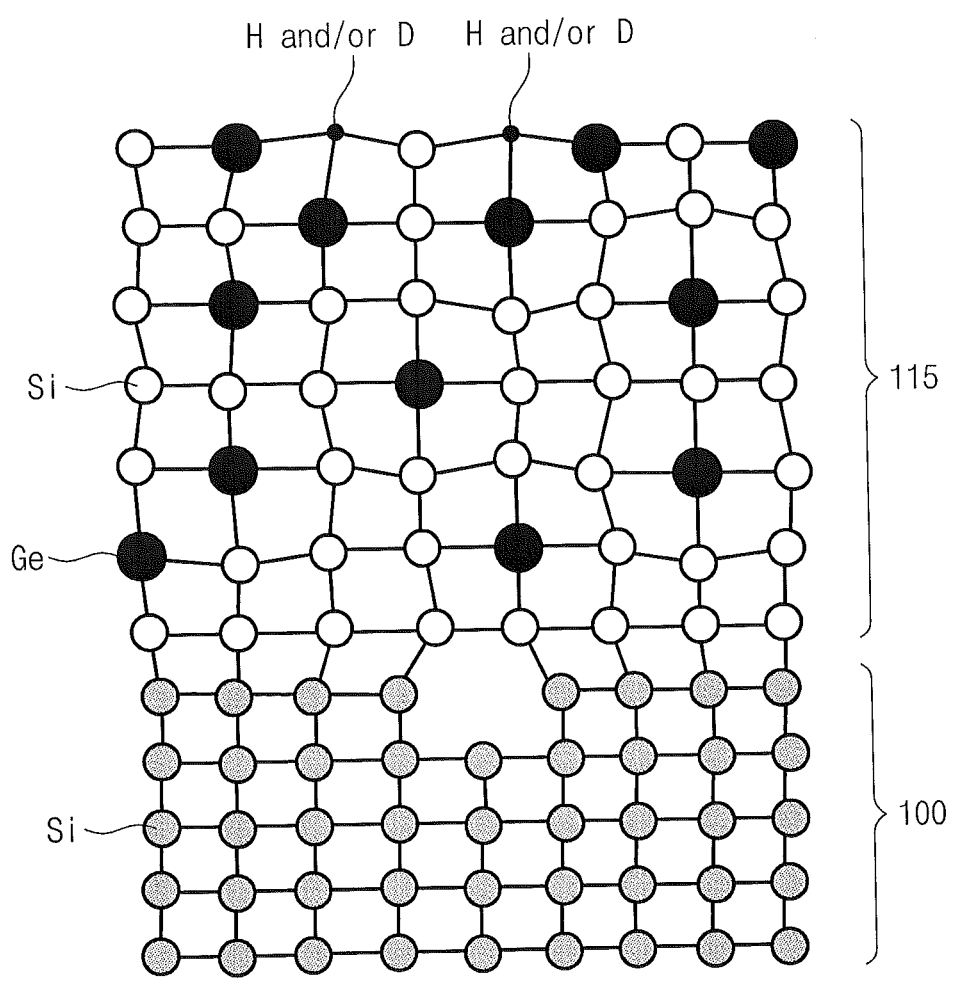

As shown in FIG. 8, the hydrogen and/or its isotopes may fill at least some vacant sites of the PMOS channel pattern 115. This enables a reduction of the number of dangling bonds that may exist in the PMOS channel pattern 115. In other words, after the hydrogen injection process HIP, the PMOS channel pattern 115 may comprise a silicon-germanium layer containing hydrogen and/or an isotope thereof. In some embodiments, a hydrogen and/or its isotope content in the PMOS channel pattern 115 may be in a range of about 0.001 atomic percent to about 1 atomic percent.

In addition, the hydrogen injection process HIP may be performed under a plasma or thermal environment. In certain embodiments, the hydrogen injection process HIP may be performed under a process condition that can reduce or prevent an additional layer from being formed on the first protection layer 160. For example, the hydrogen injection process HIP may be performed without source gases used to deposit such additional layer. Thus, a carrier gas may be supplied on the resultant structure provided with the first protection layer 160, along with the hydrogen or its isotopes during the hydrogen injection process HIP.

Figure 6:
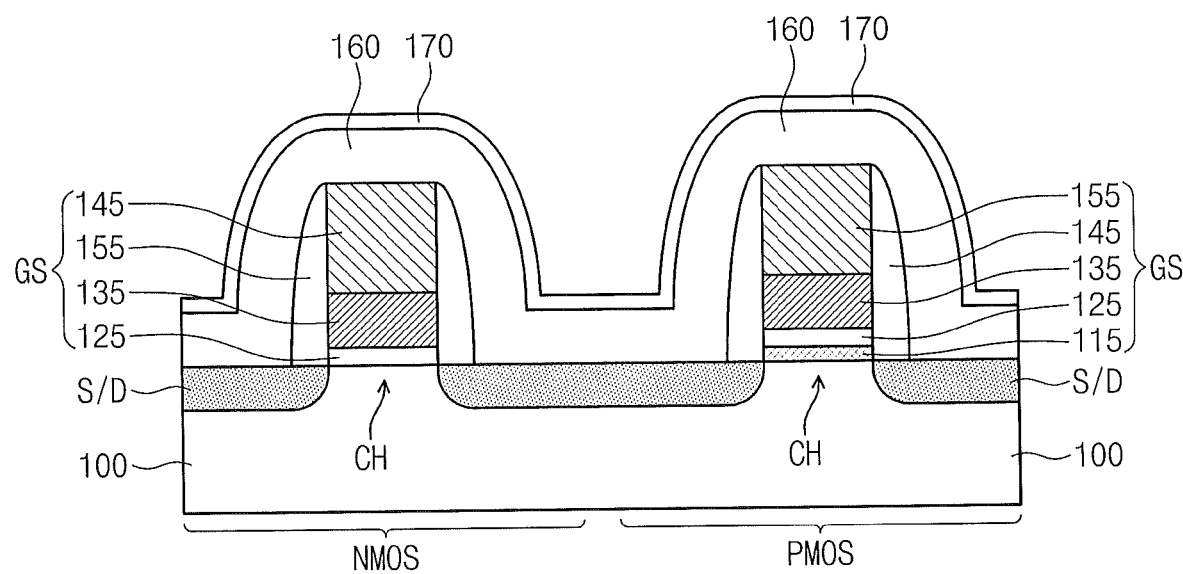

In other embodiments, as shown in FIG. 6, a second protection layer 170 may be formed on the first protection layer 160 during the hydrogen injection process HIP. For instance, the second protection layer 170 may be formed by a chemical vapor deposition technique using a process gas containing hydrogen and/or its isotopes. In other words, the hydrogen injection process HIP may serve as a part of a chemical vapor deposition process for forming the second protection layer 170. In this case, the second protection layer 170 may have a higher hydrogen and/or deuterium content, compared with the first protection layer 160.

According to various embodiments described herein, the hydrogen and/or its isotope included in the PMOS channel pattern 115 may be originated from a hydrogen and/or its isotope containing process gas that is supplied during the formation of the second protection layer 170, rather than from a hydrogen or its isotope included in the second protection layer 170 after the formation of the second protection layer 170. The plasma or thermal environment produced during the chemical vapor deposition process may facilitate the diffusion or infiltration of hydrogen and/or deuterium into the PMOS channel pattern 115. As a result, hydrogen and/or its isotopes can be easily diffused or infiltrated into the PMOS channel pattern 115, compared with when the deposited second protection layer 170 is used as a source of hydrogen or its isotopes.

The second protection layer 170 may comprise at least one tensile material. For example, the second protection layer 170 may include a material with a tensile stress of about 0.5 GPa to about 3 GPa. Thus, a resulting force of tensile stresses from the first and second protection layers 160 and 170 may be exerted on the channel region CH. In some embodiments, the first protection layer 160 may be three to ten times thicker than the second protection layer 170. However, various embodiments described herein may not be limited thereto; for instance, the first protection layer 160 may be thinner than the second protection layer 170.

According to various embodiments described herein, the gate spacers 155 may be also formed of at least one tensile material. For instance, in some embodiments, the gate spacers 155 and the first and second protection layers 160 and 170 may be formed of tensile materials.

Figure 9:
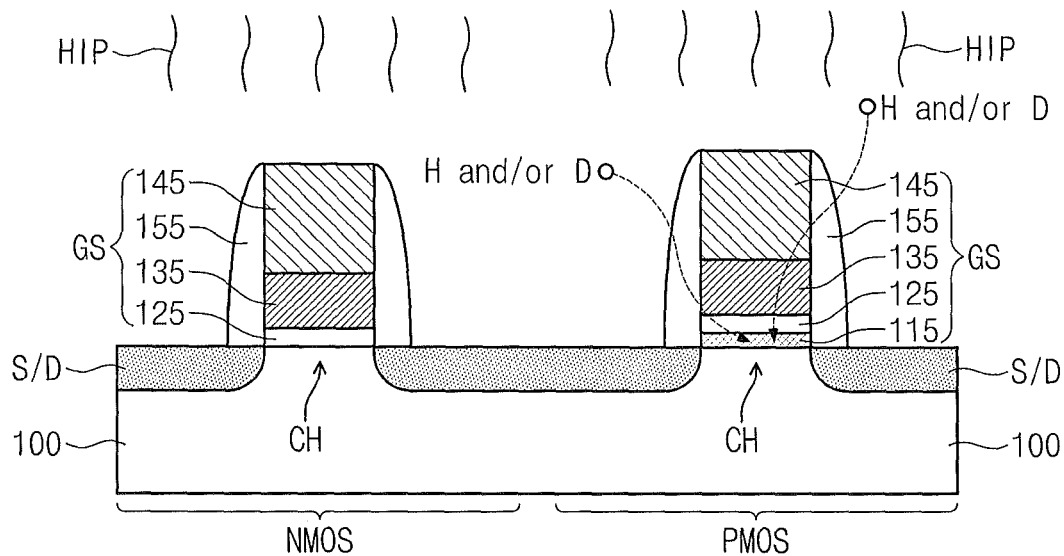
Figure 10:
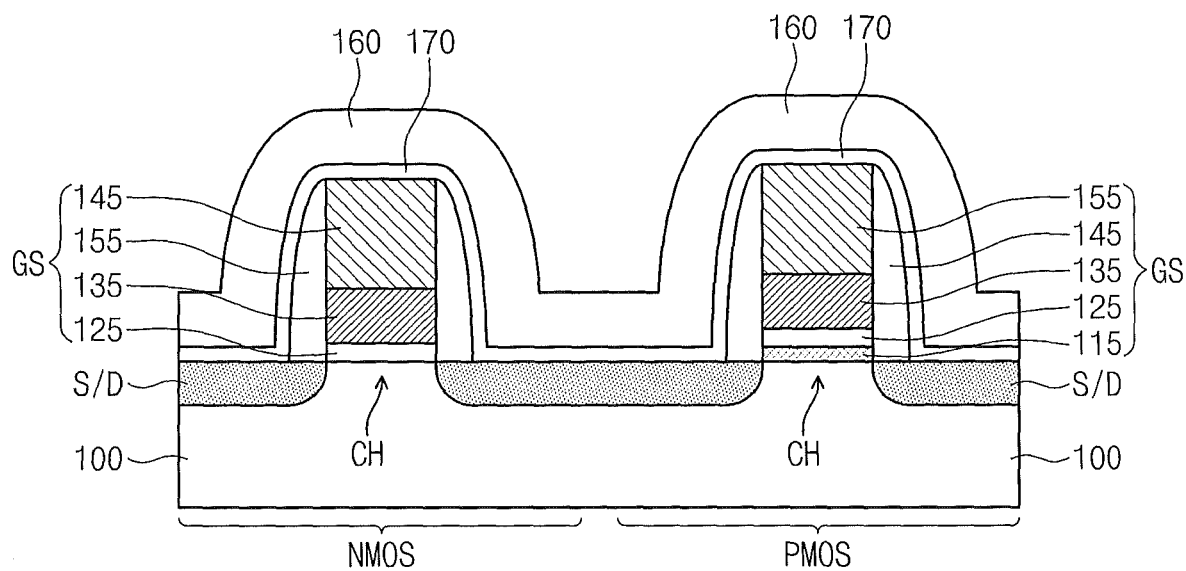

FIG. 9 is a sectional view illustrating methods of fabricating a semiconductor device according to various other embodiments described herein, and FIG. 10 is a sectional view illustrating methods of fabricating a semiconductor device according to various other embodiments described herein. For concise description, overlapping description of elements previously described with reference to FIGS. 1 through 8 may be omitted.

In various embodiments, as shown in FIG. 9, the hydrogen injection process HIP may be performed before the formation of the first protection layer 160. In other words, hydrogen and/or its isotopes supplied during the hydrogen injection process HIP can be diffused or infiltrated into the PMOS channel pattern 115 without being blocked by the first protection layer 160 described with reference to FIGS. 1 through 8. Accordingly, in the present embodiments, the hydrogen injection process HIP can be performed under an alleviated or soft plasma or thermal environment.

In some modified embodiments, the hydrogen injection process HIP may serve as a part of a process for forming the gate spacer 155. For example, the gate spacer 155 may be formed by anisotropically etching a gate spacer layer (not shown) conformally covering the gate structure GS, and the hydrogen injection process HIP may be performed as a part of a deposition process for forming the gate spacer layer. Alternatively, the anisotropic etching of the gate spacer layer may be performed in a dry etching manner using plasma, and the hydrogen injection process HIP may be performed by supplying hydrogen and/or its isotopes as a part of a process gas of the dry etching process.

Referring to FIG. 10, according to these embodiments, the hydrogen injection process HIP may be performed before the formation of the first protection layer 160 as described with reference to FIG. 9, but a second protection layer 170 may be formed between the gate spacer 155 and the first protection layer 160 during the hydrogen injection process HIP. As shown, the second protection layer 170 may be thinner than the first protection layer 160. For instance, a thickness ratio of the second protection layer 170 to the first protection layer 160 may be about 1:3 to about 1:10. However, various embodiments described herein may not be limited thereto; for instance, the second protection layer 170 may be thicker than the first protection layer 160.

Figure 11:
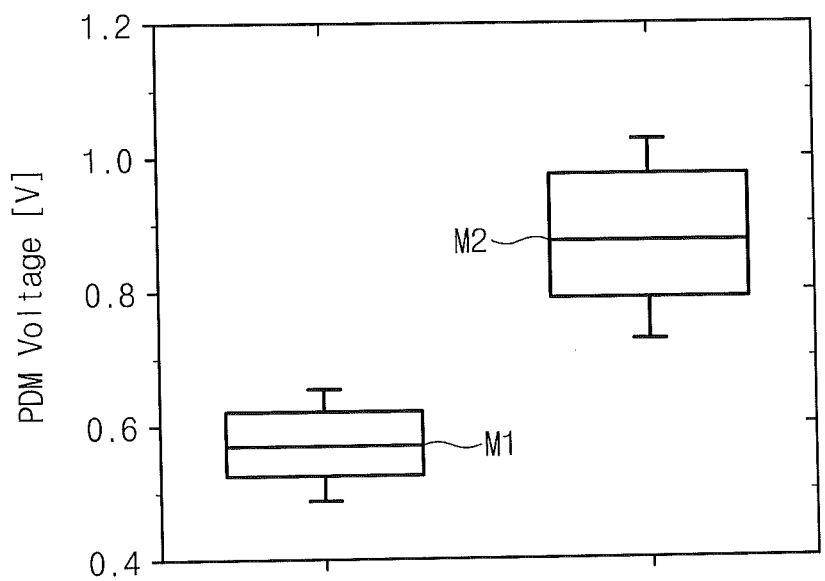
Figure 12:
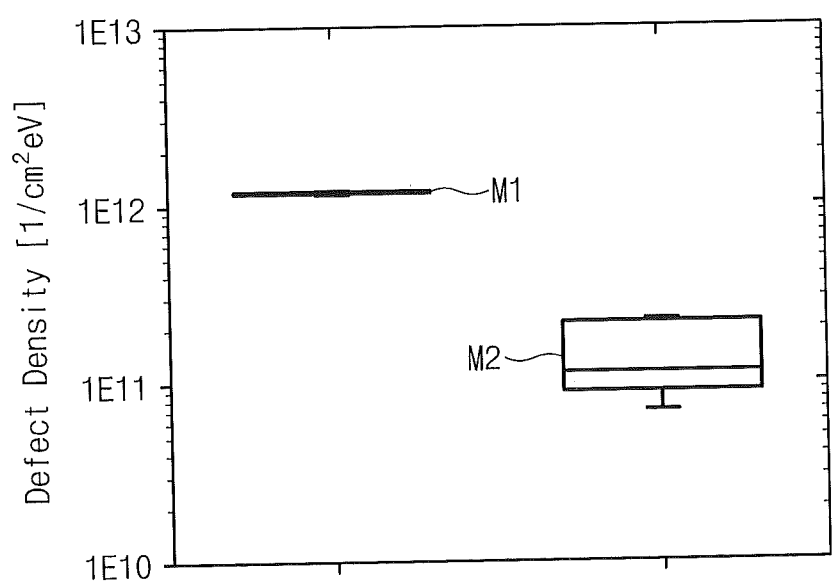

FIGS. 11 and 12 are graphs showing experimental results related to the first and second protection layers 160 and 170 of a semiconductor device according to various embodiments described herein. In more detail, first and second layers were formed on a substrate and the interfacial properties thereof were measured, where the first layer was a silicon nitride layer that does not undergo the aforementioned hydrogen injection process HIP and the second layer was a silicon nitride layer formed by a deposition process including the aforementioned hydrogen injection process HIP. In other words, the first layer and the second layer corresponded to the first and second protection layer 160 and 170, respectively.

FIG. 11 shows an experimental result obtained by measuring a plasma damage monitor (PDM) voltage, and FIG. 12 shows an experiment result obtained by measuring a defect density at interfaces between the respective first and second layer and the underlying layer. In FIGS. 11 and 12, the reference numerals M1 and M2 denote measurement data obtained from the first layer and the second layer, respectively.

The PDM voltage for a specific layer increases with increasing of a charging effect or a process-induced charging property, which may occur during the formation of the layer. Referring to FIG. 11, the second layer exhibited a higher PDM voltage than the first layer. In other words, the second layer exhibited an increased process-induced charging property compared with the first layer. This result shows that the hydrogen injection process HIP can contribute to produce more ions.

Referring to FIG. 12, a defect density was lower in experiments of the second layer than in experiments of the first layer. This result shows that interfacial defects (e.g., dangling bonds) can be effectively reduced or removed by a layer-forming process including the hydrogen injection process HIP.

Figure 13:
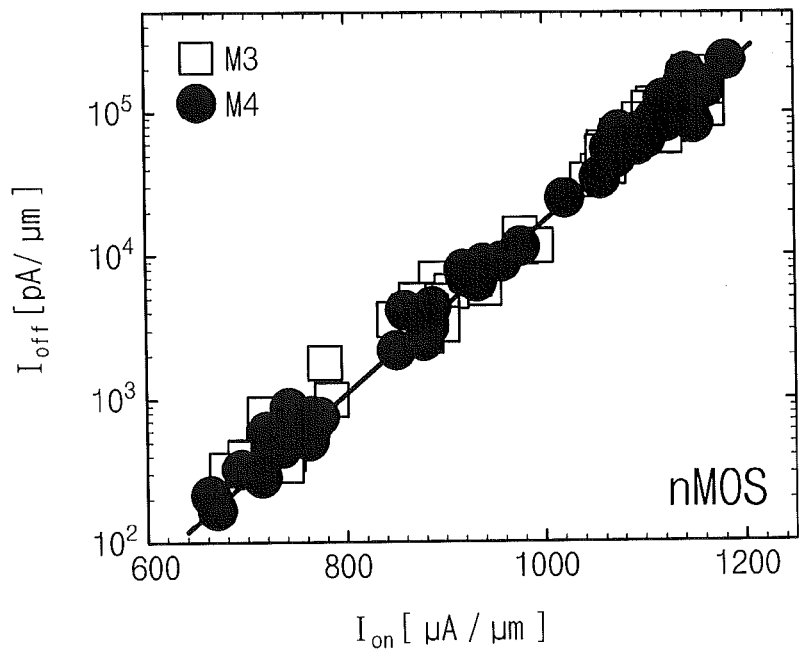
Figure 14:
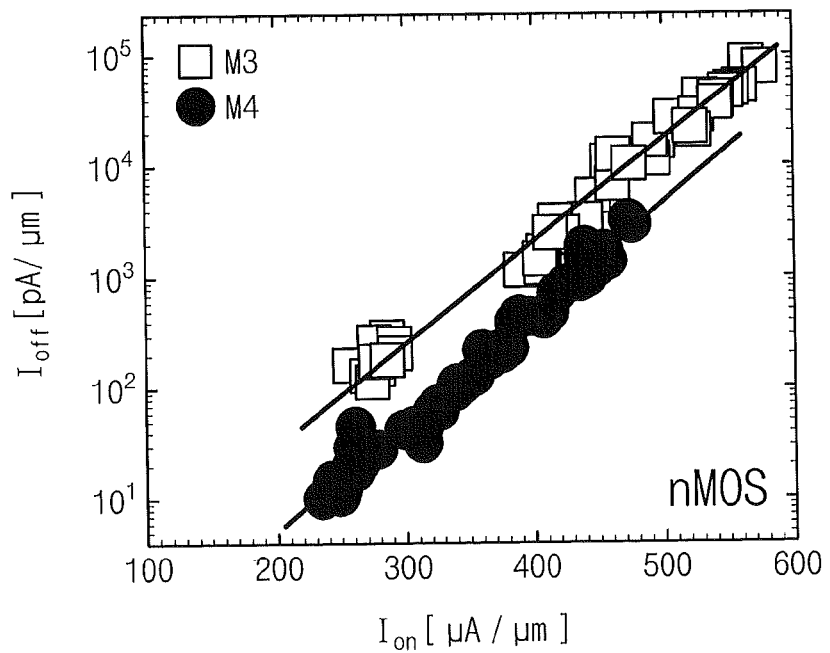
Figure 15:
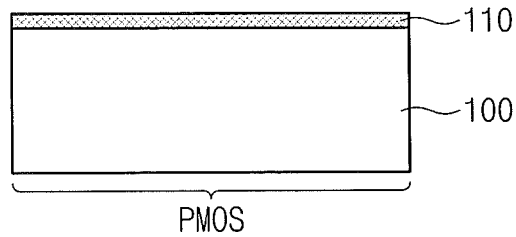
Figure 16:
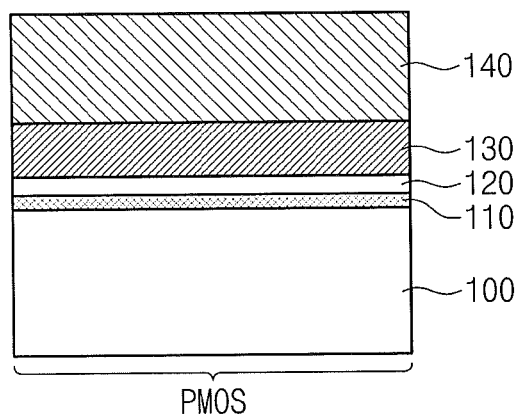
Figure 17:
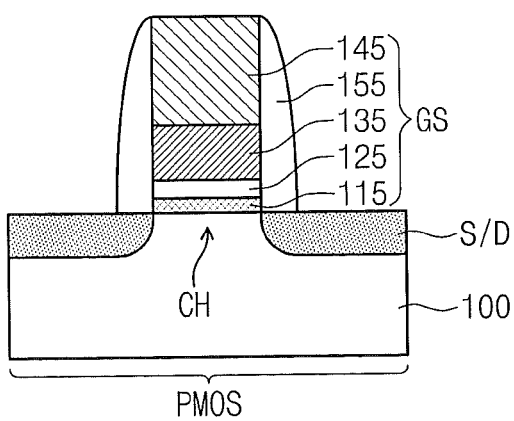
Figure 18:
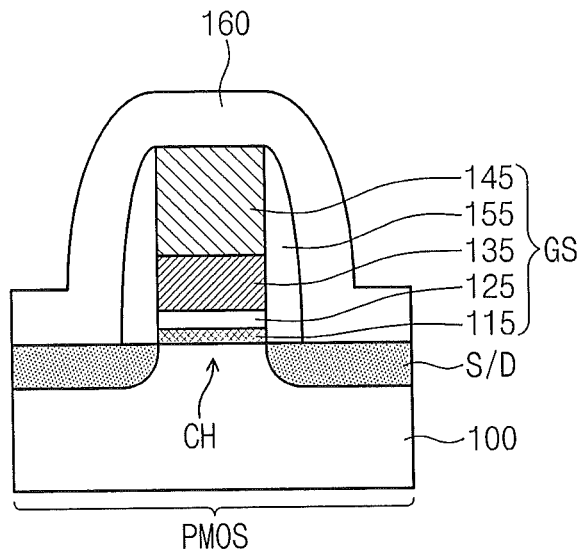
Figure 19:
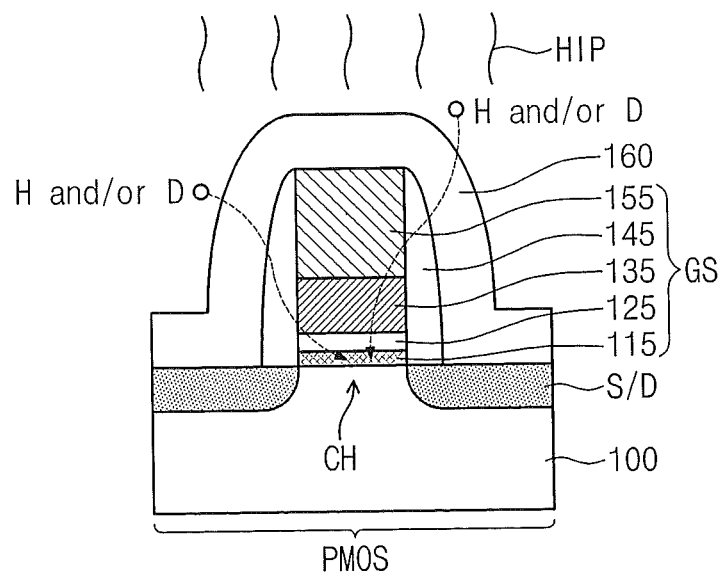
Figure 20:
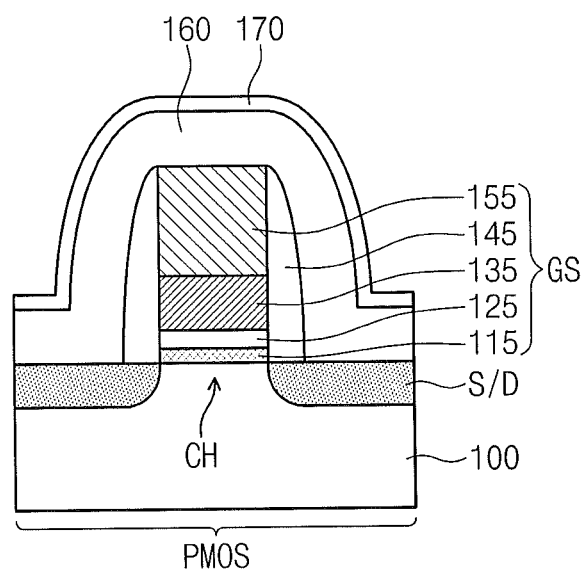
Figure 21:
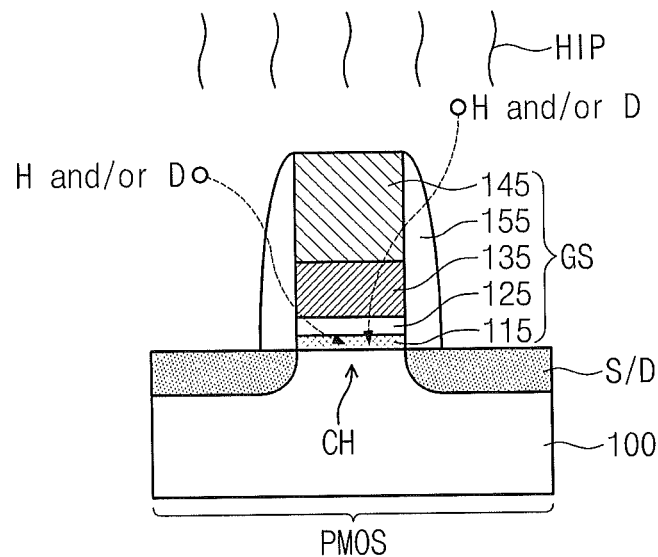
Figure 22:
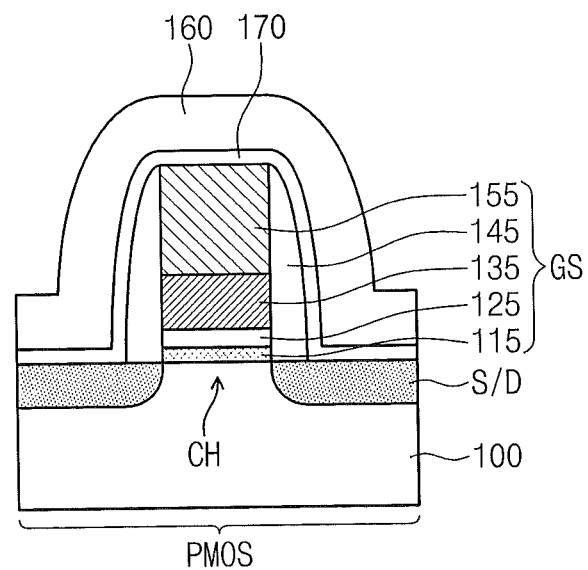

FIGS. 13 and 14 are graphs showing electric characteristics of a semiconductor device according to various embodiments described herein. FIGS. 13 and 14 show electric currents measured from NMOS and PMOS FETs, respectively, where vertical and horizontal axes represent off- and on-currents, $I_{off}$ and $I_{on}$ respectively. In FIGS. 13 and 14, the reference numerals M4 and M3 denote data measured from semiconductor devices that were configured to have structures shown in FIGS. 6 and 4, respectively. In other words, the reference numeral M3 denotes data obtained from samples, which did not undergo the hydrogen injection process HIP.

For NMOS FETs, there was no meaningful difference in an electric current property, as shown in FIG. 13. However, for PMOS FETs, samples M4, which underwent the hydrogen injection process, exhibited an improved electric current property, compared with other samples M3, which did not undergo the hydrogen injection process, as shown in FIG. 14. In more detail, at the same off-current ($I_{off}$), the samples denoted by the reference numeral M4 exhibited a 12% increase in an on-current ($I_{on}$), compared with the samples denoted by the reference numeral M3. From these experiment results, it can be seen that the hydrogen injection process HIP contributes to improve the electric current property of a PMOS FET.

FIGS. 1-12 described fabrication processes and test results for PMOS and NMOS devices. However, as shown by FIGS. 11-14, various embodiments described herein may be particularly effective for PMOS devices. Accordingly, they may be used to fabricate a PMOS device whether or not an NMOS device is also included in the substrate. Stated differently, various embodiments described herein may be used for PMOS devices that are not part of a CMOS (Complementary Metal Oxide Semiconductor) device.

FIGS. 15-22 illustrate processes for fabricating PMOS devices and devices so fabricated, that correspond to the right side of FIGS. 1-6 and 9-10, respectively. Since the right side of these figures has already been described above, this description will not be repeated in the interest of brevity.

Accordingly, various embodiments described herein may be used to fabricate a PMOS transistor including a channel layer and a gate structure on the channel layer, wherein the channel layer of the PMOS transistor comprises silicon-germanium and includes therein hydrogen and/or an isotope thereof. Protection layers, fabrication processes and test results that were described in connection with FIGS. 1-14 may also be employed.

Figure 23:
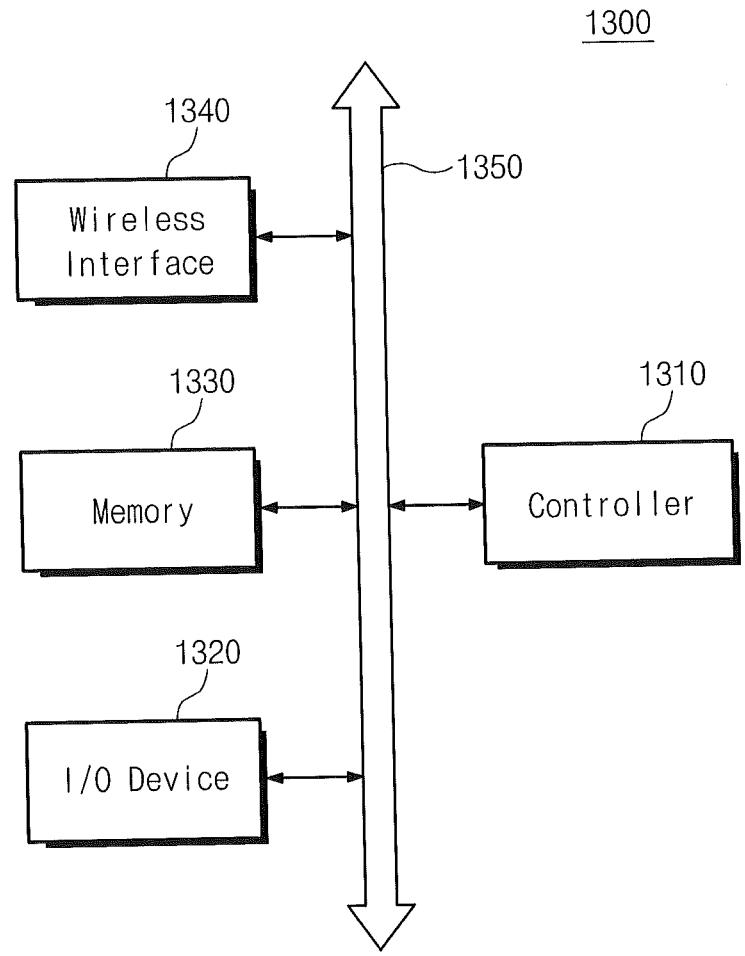
Figure 24:
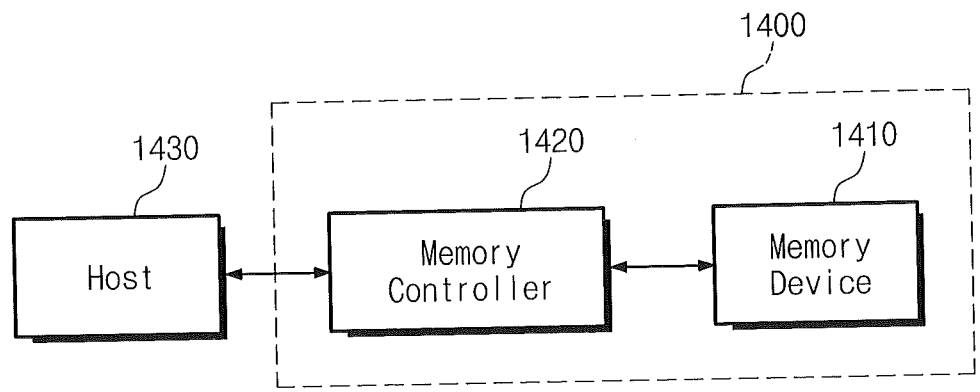

FIGS. 23 and 24 are block diagrams illustrating electronic devices including a semiconductor device according to various embodiments described herein.

Referring to FIG. 23, an electronic device 1300 including a semiconductor device according to various embodiments described herein will be described. The electronic device 1300 may be used in a PDA, a laptop computer, a mobile computer, a web tablet, a wireless phone, a cell phone, a digital music player, a wired and/or wireless electronic device, and/or a complex electronic device including at least two of these devices. The electronic device 1300 may include a controller 1310, an input/output (I/O) device 1320 such as a keypad, a keyboard and/or a display; a memory 1330; and/or a wireless interface 1340 that communicate with each other through a bus 1350. The controller 1310 may include, for example, at least one microprocessor, a digital signal processor, a microcontroller and/or the like. The memory 1330 may be configured to store a command code to be used by the controller 1310 and/or user data. The memory 1330 may include a semiconductor device according to various embodiments described herein. The electronic device 1300 may use a wireless interface 1340 configured to transmit data to and/or receive data from a wireless communication network using an RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA and/or CDMA2000.

Referring to FIG. 24, a memory system including a semiconductor device according to various embodiments described herein will be described. The memory system 1400 may include a memory device 1410 for storing large amounts of data and a memory controller 1420. The memory controller 1420 controls the memory device 1410 so as to read data stored in the memory device 1410 and/or to write data into the memory device 1410 in response to a read/write request of a host 1430. The memory controller 1420 may include an address mapping table for mapping an address provided from the host 1430 (e.g., a mobile device and/or a computer system) into a physical address of the memory device 1410. The memory device 1410 and/or the memory controller 1420 may be a semiconductor device according to various embodiments described herein.

According to various embodiments described herein, a PMOS channel may be formed of silicon-germanium containing hydrogen and/or its isotopes. This allows reduction in the number of defects in the PMOS channel and can improve PMOS performance.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a semiconductor device, comprising:
   providing a substrate including a silicon channel layer and a silicon-germanium channel layer;
   forming gate structures disposed on the silicon channel layer and the silicon-germanium channel layer, respectively;
   forming a first protection layer on the substrate including on the gate structures; and
   injecting hydrogen and/or an isotope thereof into the silicon-germanium channel layer,
   wherein the injecting hydrogen and/or an isotope thereof into the silicon-germanium channel layer is performed before the forming a first protection layer on the substrate including on the gate structures and/or after the forming a first protection layer on the substrate including on the gate structures.

2. The method of claim 1, wherein the first protection layer comprises a tensile material.

3. The method of claim 1, wherein the injecting hydrogen and/or an isotope thereof into the silicon-germanium channel layer comprises performing chemical vapor deposition in which a process gas includes the hydrogen and/or the isotope thereof.

4. The method of claim 1, wherein the injecting hydrogen and/or an isotope thereof into the silicon-germanium channel layer comprises forming a second protection layer on the gate structures, wherein the first and second protection layers comprise tensile materials.

5. The method of claim 4, wherein the first and second protection layers comprise silicon nitride, and the second protection layer has a greater process-induced charging property than the first protection layer.

6. The method of claim 1, further comprising, before forming the first protection layer, forming gate spacers on sidewalls of the gate structures to spatially separate the first protection layer from the sidewall of the gate structure.

7. The method of claim 1, wherein the forming of the gate structures comprises:
   forming a metal oxide layer on the substrate;
   forming a metal layer on the metal oxide layer; and
   patterning the metal layer to form a metal gate electrode crossing over the silicon channel layer or the silicon-germanium channel layer.

8. A method of fabricating a semiconductor device, comprising:
   providing a substrate including a silicon channel layer and a silicon-germanium channel layer;
   forming gate structures disposed on the silicon channel layer and the silicon-germanium channel layer, respectively;
   forming a first protection layer on the substrate including on the gate structures; and
   injecting a hydrogen isotope into the silicon-germanium channel layer.

9. The method of claim 8, wherein the first protection layer comprises a tensile material.

10. The method of claim 8, wherein the injecting of a hydrogen isotope is followed by the forming of the first protection layer.

11. The method of claim 8, wherein the injecting of a hydrogen isotope follows the forming of the first protection layer.

12. The method of claim 8, wherein the injecting of a hydrogen isotope comprises performing chemical vapor deposition in which a process gas includes the hydrogen isotope.

13. The method of claim 8, wherein the injecting of a hydrogen isotope comprises forming a second protection layer on the gate structures, wherein the first and second protection layers comprise tensile materials.

14. The method of claim 13, wherein the first and second protection layers comprise silicon nitride, and the second protection layer has a greater process-induced charging property than the first protection layer.

15. The method of claim 8, further comprising, before forming the first protection layer, forming gate spacers on sidewalls of the gate structures to spatially separate the first protection layer from the sidewall of the gate structure.

16. The method of claim 8, wherein the forming of the gate structures comprises:
   forming a metal oxide layer on the substrate;
   forming a metal layer on the metal oxide layer; and
   patterning the metal layer to form a metal gate electrode crossing over the silicon channel layer or the silicon-germanium channel layer.

* * * * *